United States Patent
Pritchard et al.

(10) Patent No.: US 12,513,995 B2
(45) Date of Patent: Dec. 30, 2025

(54) SUBSTRATES OF SEMICONDUCTOR DEVICES HAVING VARYING THICKNESSES OF SEMICONDUCTOR LAYERS

(71) Applicant: GLOBALFOUNDRIES U.S. Inc., Malta, NY (US)

(72) Inventors: David Pritchard, Malta, NY (US); Hongru Ren, Boise, ID (US); Shafiullah Syed, Murphy, TX (US); Hong Yu, Clifton Park, NY (US); Man Gu, Malta, NY (US); Jianwei Peng, Clifton Park, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 466 days.

(21) Appl. No.: 17/820,248

(22) Filed: Aug. 17, 2022

(65) Prior Publication Data

US 2024/0063225 A1  Feb. 22, 2024

(51) Int. Cl.
*H10D 87/00* (2025.01)
*H10D 86/01* (2025.01)

(52) U.S. Cl.
CPC ............. *H10D 87/00* (2025.01); *H10D 86/01* (2025.01)

(58) Field of Classification Search
None
See application file for complete search history.

(56) References Cited

U.S. PATENT DOCUMENTS

| | | | |
|---|---|---|---|
| 6,879,000 B2 | 4/2005 | Yeo et al. | |
| 7,049,661 B2 | 5/2006 | Yamada et al. | |
| 7,253,068 B1 | 8/2007 | Ju et al. | |
| 9,799,756 B1 | 10/2017 | Chan et al. | |
| 10,141,229 B2 | 11/2018 | Faul et al. | |
| 10,263,012 B2 | 4/2019 | Makiyama et al. | |
| 2016/0087069 A1* | 3/2016 | Oda | H10D 62/834 257/77 |
| 2020/0051808 A1* | 2/2020 | Metze | H01L 21/0245 |
| 2021/0327902 A1* | 10/2021 | Singh | H01L 21/02002 |
| 2023/0038887 A1* | 2/2023 | Sporer | H10F 39/8037 |

OTHER PUBLICATIONS

U.S. Appl. No. 17/669,854, filed Feb. 11, 2022, Gu et al.
Matthew K. Emsley et al.,High-Speed Resonant-Cavity-Enhanced Silicon Photodetectors on Reflecting Silicon-on-Insulator Substrates, IEEE Photonics Technology Letters, vol. 14, No. 4, pp. 519-521, Apr. 2002, doi: 10.1109/68.992597.
J.-B. Yau et al., SiGe-on-Insulator Symmetric Lateral Bipolar Transistors, 2015 IEEE SOI-3D-Subthreshold Microelectronics Technology Unified Conference (S3S), Oct. 2015, pp. 1-2, doi: 10.1109/S3S.2015.7333533.

\* cited by examiner

*Primary Examiner* — Daniel Whalen
(74) *Attorney, Agent, or Firm* — Francois Pagette

(57) ABSTRACT

A substrate is provided. The substrate includes a base, a semiconductor layer over the base, and an insulator layer between the base and the semiconductor layer. The semiconductor layer has a first semiconductor layer portion having a first thickness, a second semiconductor layer portion having a second thickness, and a third semiconductor layer portion having a third thickness, and the first thickness, the second thickness, and the third thickness are different from each other.

13 Claims, 3 Drawing Sheets

SUBSTRATES OF SEMICONDUCTOR DEVICES HAVING VARYING THICKNESSES OF SEMICONDUCTOR LAYERS

TECHNICAL FIELD

The present disclosure relates generally to semiconductor devices, and more particularly to substrates of semiconductor devices having varying thicknesses of semiconductor layers and methods of forming the same.

BACKGROUND

Technology advancement in the semiconductor industry comes with a continuing demand for greater integration of semiconductor devices onto a semiconductor chip to provide a multitude of functions. Examples of semiconductor devices may include active devices such as transistors and diodes, and passive devices such as capacitors and resistors.

The semiconductor devices may be fabricated in and upon a substrate. Different semiconductor devices may have different substrate requirements to achieve optimum device performance. Therefore, substrates supporting improved integration of semiconductor devices, and methods of forming the same are provided.

SUMMARY

To achieve the foregoing and other aspects of the present disclosure, substrates of semiconductor devices having varying thicknesses of semiconductor layers and methods of forming the same are presented.

According to an aspect of the present disclosure, a substrate is provided. The substrate includes a base, a semiconductor layer over the base, and an insulator layer between the base and the semiconductor layer. The semiconductor layer has a first semiconductor layer portion having a first thickness, a second semiconductor layer portion having a second thickness, and a third semiconductor layer portion having a third thickness, and the first thickness, the second thickness, and the third thickness are different from each other.

According to another aspect of the present disclosure, a substrate is provided. The substrate includes a base, a semiconductor layer over the base, isolation structures, and an insulator layer between the base and the semiconductor layer. The semiconductor layer has a first semiconductor layer portion, a second semiconductor layer portion thicker than the first semiconductor layer portion, and a third semiconductor layer portion thicker than the second semiconductor layer portion. The isolation structures are separating the first semiconductor layer portion, the second semiconductor layer portion, and the third semiconductor layer portion from each other.

According to yet another aspect of the present disclosure, a method of forming a substrate is provided. The method includes forming a precursor including a base, an insulator layer over the base, and a first semiconductor layer over the insulator layer, and forming a second semiconductor layer over the precursor. A first portion of the second semiconductor layer is in contact with the base and a second portion of the second semiconductor layer is in contact with a portion of the first semiconductor layer.

BRIEF DESCRIPTION OF THE DRAWINGS

The embodiments of the present disclosure will be better understood from a reading of the following detailed description, taken in conjunction with the accompanying drawings.

Figure 1A:
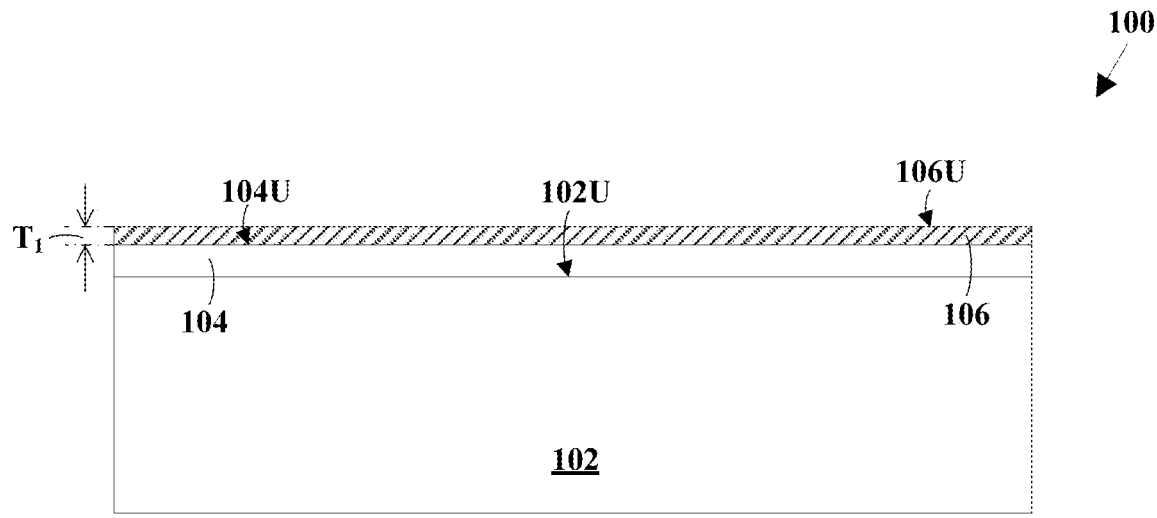
FIGS. 1A through 1D are cross-sectional views of a semiconductor substrate, illustrating a method of forming varying thicknesses of semiconductor layers thereof, according to an embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the disclosure.

Additionally, features in the drawings are not necessarily drawn to scale. For example, the dimensions of some of the features in the drawings may be exaggerated relative to other features to help improve understanding of embodiments of the device. The same reference numerals in different drawings denote the same features, while similar reference numerals may, but do not necessarily, denote similar features.

DETAILED DESCRIPTION

The present disclosure relates to substrates of semiconductor devices having varying thicknesses of semiconductor layers and methods of forming the same. Various embodiments of the present disclosure are now described in detail with accompanying drawings. It is noted that like and corresponding features are referred to by the use of the same reference numerals. The embodiments disclosed herein are exemplary, and not intended to be exhaustive or limiting to the disclosure.

FIGS. 1A through 1D are cross-sectional views of a substrate 100, illustrating a method of forming varying thicknesses of a semiconductor layer thereof, according to an embodiment of the disclosure. The substrate 100 may serve as a supporting structure upon which and/or within which the features of semiconductor devices are fabricated. Certain structures may be conventionally fabricated, for example, using known processes and techniques, and specifically disclosed processes and methods may be used to achieve individual aspects of the present disclosure.

FIG. 1A is a cross-sectional view of the substrate 100 at an initial fabrication stage of a processing method, according to an embodiment of the disclosure. The substrate 100 may serve as a precursor upon which varying thicknesses of a semiconductor layer may be formed. The substrate 100 may include a base 102, an insulator layer 104, and a semiconductor layer 106. In an embodiment of the disclosure, the substrate 100 may include a commercially available layered substrate, for example, a semiconductor-on-insulator (aII) substrate.

The base 102 may include a crystalline semiconductor material, for example, silicon, silicon germanium, silicon carbide, or other II-VI or III-V semiconductor compounds. The base 102 has an upper surface 102U.

The insulator layer 104 may be arranged between the base 102 and the semiconductor layer 106, and may serve to electrically isolate the semiconductor layer 106 from the base 102. The insulator layer 104 may include an insulating material, for example, silicon dioxide or sapphire. In the instance where the insulating material is silicon dioxide, the insulator layer 104 may also be referred to as a buried oxide (BOX) layer.

The semiconductor layer 106 may be arranged over and in contact with an upper surface 104U of the insulator layer 104. The semiconductor layer 106 may include a crystalline semiconductor material, for example, silicon, silicon germanium, silicon carbide, or other II-VI or III-V semiconductor compounds. The semiconductor material of the semiconductor layer 106 may be doped or undoped. In an embodiment of the disclosure, the semiconductor material of the semiconductor layer 106 may include the same semiconductor material as the base 102. In another embodiment of the disclosure, the semiconductor material of the semiconductor layer 106 may include a different semiconductor material than the base 102.

The semiconductor layer 106 may have a thickness $T_1$, and the thickness $T_1$ may be substantially uniform. In an embodiment of the disclosure, the thickness $T_1$ of the semiconductor layer 106 may be a range of about 5 nanometers (nm) to about 15 nm.

The semiconductor layer 106 may be where various device features, for example, conductive wells, isolation structures, gate structures, and contact structures are fabricated in, adjacent to, and/or above the semiconductor layer 106. The semiconductor layer 106 may also be referred to as a device layer or an active layer of the semiconductor devices.

Figure 1B:
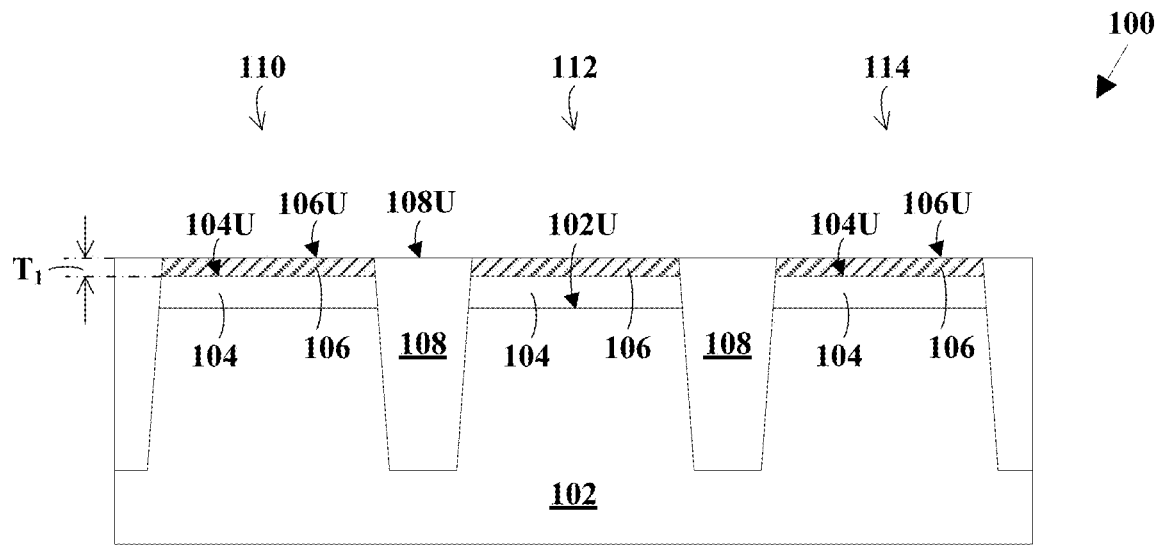

FIG. 1B is a cross-sectional view of the substrate 100 at a fabrication stage subsequent to FIG. 1A, according to an embodiment of the disclosure. Isolation structures 108 may be formed in the substrate 100. The isolation structures 108 may define regions, for example, regions 110, 112, 114, in the substrate 100 where various device features may be formed therein and thereupon. The regions 110, 112, 114 may be electrically isolated from each other by the isolation structures 108. The isolation structures 108 may include, for example, shallow trench isolation structures. Even though FIG. 1B illustrates the regions 110, 112, 114 as being immediately adjacent to each other, the regions 110, 112, 114 may not be so without departing from the scope and spirit of the disclosure.

The isolation structures 108 may be formed by an exemplary process as described herein. The substrate 100 may be patterned using a patterning technique, including lithography and etching processes, to form openings (not shown) therein. The openings may be formed through the semiconductor layer 106 and the insulator layer 104, and may terminate within the base 102. The openings may be subsequently filled with a dielectric material, for example, silicon dioxide, to form the isolation structures 108. In an embodiment of the disclosure, the isolation structures 108 may include an upper surface 108U, and the upper surface 108U of the isolation structures 108 may be substantially coplanar with the upper surface 106U of the semiconductor layer 106.

The regions 110, 112, 114 may each include a portion of the semiconductor layer 106 and a portion of the insulator layer 104. Since the regions 110, 112, 114 may be electrically isolated from each other by the isolation structures 108, the regions 110, 112, 114 may enable the fabrication of the various device features having different substrate requirements. For example, the regions 110, 114 may be defined as active regions where active features, such as transistors, may be formed therein and thereupon. The region 112 may be arranged between the regions 110, 114 and may serve as a passive region where passive features, such as well taps, may be formed therein.

Figure 1C:
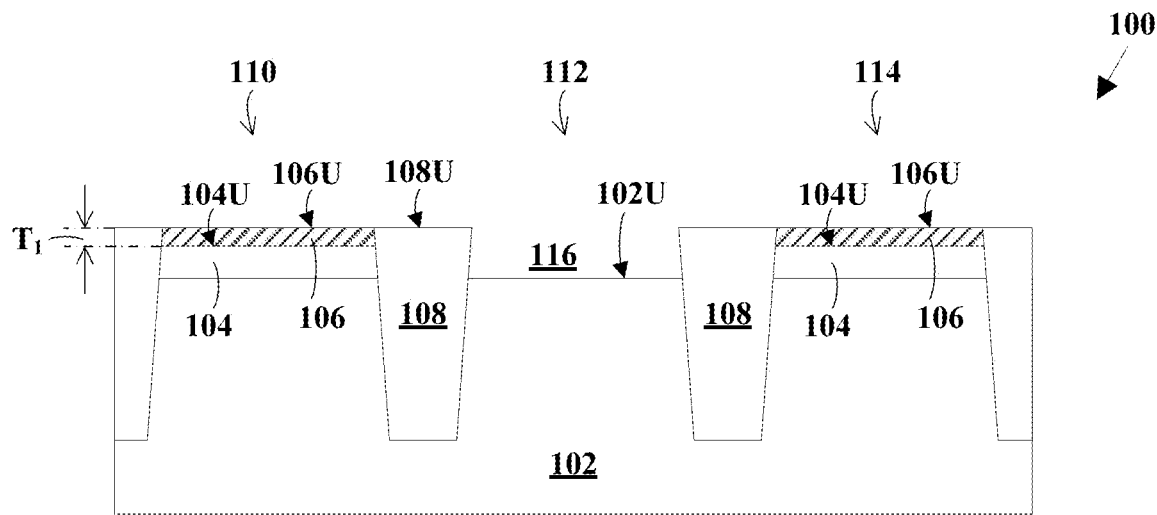

FIG. 1C is a cross-sectional view of the substrate 100 at a fabrication stage subsequent to FIG. 1B, according to an embodiment of the disclosure. An opening 116 may be formed in the region 112 by removing the portion of semiconductor layer 106 and the portion of the insulator layer 104 therein using a patterning technique, including lithography and etching processes. A portion of the base 102 may be exposed in the opening 116.

Figure 1D:
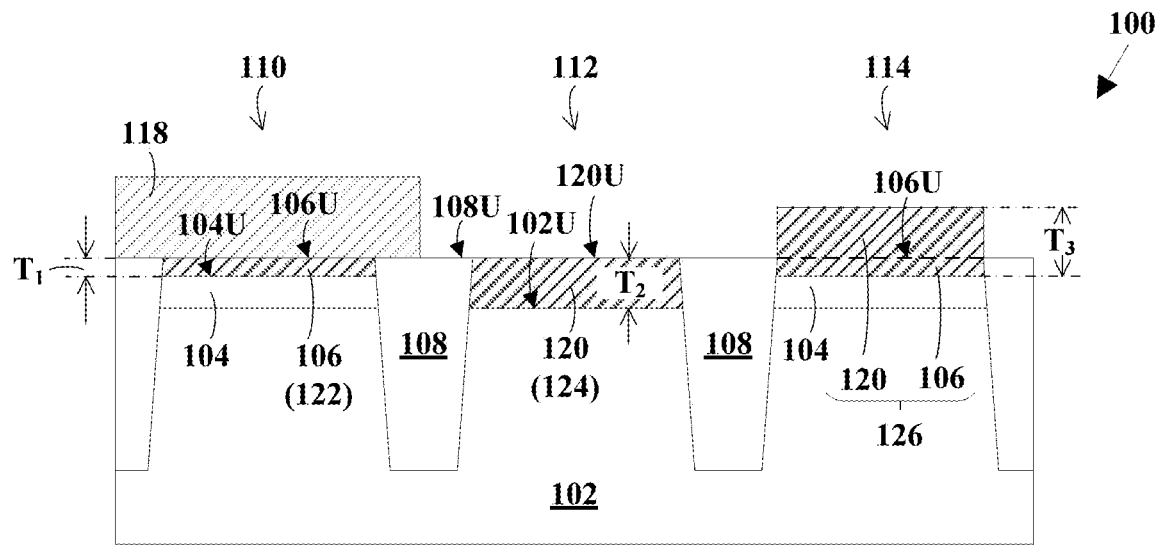

FIG. 1D is a cross-sectional view of the substrate 100 at a fabrication stage subsequent to FIG. 1C, according to an embodiment of the disclosure. A mask layer 118 may be deposited over the substrate 100 and patterned using a patterning technique to expose areas where an additional semiconductor material may be deposited. For example, it may be desirable to have additional semiconductor material deposited in the regions 112, 114 which are, therefore, exposed. On the other hand, it may be desirable to retain the thickness $T_1$ of the semiconductor layer 106 in the region 110 and is, therefore, covered by the mask layer 118.

The substrate 100 may undergo an epitaxy process to grow an epitaxial semiconductor layer 120. The epitaxy process is a selective deposition process where growth of the epitaxial semiconductor material only occurs over crystalline surfaces while non-crystalline surfaces remain substantially free of the epitaxial semiconductor material. For example, the upper surface 102U of the base 102 in the region 112 and the upper surface 106U of the semiconductor layer portion 106' in the region 114 may serve as growth surfaces during the epitaxy process to grow the epitaxial semiconductor layer 120, while the mask layer 118 and the isolation structures 108 will not have any epitaxial growth thereupon.

The epitaxial semiconductor layer 120 may include a crystalline semiconductor material, for example, silicon, silicon germanium, silicon carbide, or other II-VI or III-V semiconductor compounds. In an embodiment of the disclosure, the epitaxy process may be a homoepitaxy process, where the epitaxial semiconductor layer 120 has the same material composition as the base 102 and the semiconductor layer 106, for example, silicon. In another embodiment of the disclosure, the epitaxy process may be a heteroepitaxy process, where the epitaxial semiconductor layer 120 has a different material composition than the base 102 and the semiconductor layer 106. In yet another embodiment of the disclosure, the epitaxial semiconductor layer 120 may be doped in-situ or using an ion implantation process with an appropriate dopant.

The epitaxial semiconductor layer 120 may be concurrently grown over the upper surface 102U of the base 102 in the region 112 and the upper surface 106U of the semiconductor layer portion 106' in the region 114. The transition of the semiconductor layer 106 and the epitaxial semiconductor layer 120 in the region 114 is demarcated by a dashed line for purposes of illustration.

The amount of epitaxial material to be grown may vary depending upon the type of device features to be fabricated thereupon and/or the application for such a device feature. For example, the epitaxy process may be stopped at a point where the epitaxial semiconductor layer 120 substantially fills the opening 116 to a level such that an upper surface 120U thereof is substantially coplanar with the upper surface 106U of the portion of the semiconductor layer 106 in the region 110, as illustrated in FIG. 1D. In an embodiment of the disclosure, the upper surface 120U of the epitaxial semiconductor layer 120 may be substantially coplanar with the upper surface 108U of the isolation structures 108 such that the region 110 and the region 112 may achieve a substantially planar topography.

Alternatively, the epitaxial semiconductor layer 120 in the region 112 may be grown until the upper surface 120U thereof is below or above the upper surface 106U of the portion of the semiconductor layer 106 in the region 110, even though this embodiment is not shown in the accompanying drawings. In an embodiment of the disclosure, the epitaxial semiconductor layer 120 may have a thickness $T_2$ in a range of about 10 nm to about 25 nm.

Processing continues with the removal of the mask layer 118 and the substrate 100 may continue with subsequent processing steps to form various device features of semiconductor devices therein and thereupon the substrate 100.

The semiconductor layer portion 106' in the region 110 may function as a device layer 122 thereof, the epitaxial semiconductor layer 120 in the region 112 may form a device layer 124 thereof, and the epitaxial semiconductor layer 120 and the semiconductor layer portion 106' in the region 114 may function as a device layer 126 thereof. The device layer 124 in the region 112 may be thicker than the device layer 122 in the region 110 and the device layer 126 in the region 114 may be thicker than the device layer 124 in the region 112. The device layer 124 in the region 112 may function substantially similar to a device layer of a bulk substrate. In an embodiment of the disclosure, the device layer 126 may have a thickness $T_3$, and the thickness $T_3$ may be in a range of about 15 nm to about 40 nm.

As the growth rate of the epitaxial material depends on various factors, including the available growth surface area, the epitaxial semiconductor layer 120 grown in the region 114 may or may not achieve the same thickness $T_2$ as the epitaxial semiconductor layer 120 grown in the region 112. Therefore, in order to achieve the desired thickness of the device layer 126 in the region 114, design optimization of the available growth surface area in the region 112 and/or the region 114 may be advantageous.

The different thicknesses of the device layers 122, 124, 126 advantageously support semiconductor devices that have different substrate requirements. For example, some semiconductor devices, such as transistors for logic or memory applications, may benefit from a thinner device layer, while other semiconductor devices, such as transistors for analog applications, may benefit from a thicker device layer. The thicker device layer may enhance certain electrical properties of the semiconductor devices formed therein and thereupon, including enhanced high-current injection performance, better electrical-thermal reliability, and lower electrical noise.

Other device features, such as well taps that are typically arranged in the base substrate may be arranged to be fabricated in the region 112. The well taps arranged in the region 112 may enable greater scaling with a reduced footprint. Additionally, the substantially planar topography between the regions 110, 112 may also facilitate subsequent processes, such as a chemical-mechanical planarization process, that may be challenging in regions having uneven topography.

Figure 2:
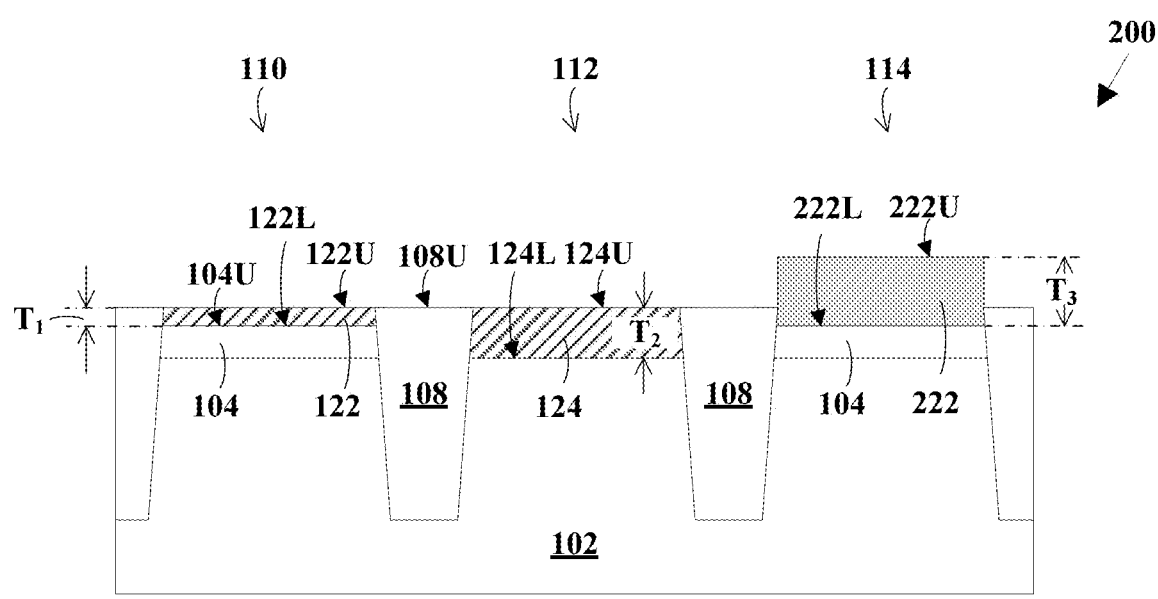
FIG. 2 illustrates a cross-sectional view of a semiconductor substrate, according to an alternative embodiment of the disclosure.

FIG. 2 illustrates a substrate 200 at a fabrication stage subsequent to FIG. 1D, according to an alternative embodiment of the disclosure. The substrate 200 may be similar to the substrate 100 in FIGS. 1A through 1D, and thus common features are labeled with the same reference numerals and need not be discussed. For example, the substrate 200 may include a base 102 and an insulator layer 104 over the base 102.

The substrate 200 may include a device layer 122 in the region 110, a device layer 124 in the region 112, and a device layer 222 in the region 114. The device layer 122 and the device layer 222 may be in contact with the insulator layer 104, while the device layer 124 may be arranged in contact with the base 102.

The device layers 122, 124, 222 may have varying thicknesses. For example, the device layer 124 may be thicker than the device layer 122 and the device layer 222 may be thicker than the device layer 124. Due to the varying thicknesses of the device layers 122, 124, 222, the substrate 200 may also have varying thicknesses in the regions 110, 112, 114.

In an embodiment of the disclosure, the device layer 122 may have an upper surface 122U, the device layer 124 may have an upper surface 124U, the device layer 222 may have an upper surface 222U, and the upper surface 222U of the device layer 222 may be arranged over the upper surfaces 124U, 124U of the device layers 122, 124, respectively. In another embodiment of the disclosure, the device layer 122 may have a lower surface 122L, the device layer 124 may have a lower surface 124L, and the device layer 222 may have a lower surface 222L, and the lower surface 124L of the device layer 124 may be arranged under the lower surfaces 122L, 222L of the device layers 122, 222, respectively. In yet another embodiment of the disclosure, the lower surfaces 122L, 222L of the device layers 122, 222 may be substantially coplanar. In a further embodiment of the disclosure, the upper surfaces 122U, 124U of the device layers 122, 124 and the upper surface 108U of the isolation structure 108 may be substantially coplanar, and a substantially planar topography across the regions 110, 112 may be achieved.

The device layers 122, 124, 222 may not necessarily have the same material composition. For example, the device layer 122 may be undoped and the device layer 124 may be doped. In another example, the device layer 122 may include silicon and the device layer 222 may include another semiconductor material, for example, silicon germanium.

In an instance where it may be desirable for the device layer 222 to be silicon germanium, the device layer 222 may be converted from silicon by an exemplary process as described herein. A mask layer (not shown) may be deposited over the substrate 200 and patterned using a patterning technique to expose the device layer 222. The exposed device layer 222 may be converted to another semiconductor material using a conversion technique, including a condensation process. For example, a layer of germanium may be deposited over the device layer 222 and the substrate 200 may undergo a thermal process to achieve composition homogenization by diffusion of germanium atoms into the device layer 222 and form a layer of silicon germanium. The condensation process may also be referred to as an enrichment process.

The terms "top", "bottom", "over", "under", and the like in the description and the claims, if any, are used for descriptive purposes and not necessarily for describing permanent relative positions. It is to be understood that the terms so used are interchangeable under appropriate circumstances such that the embodiments of the devices described herein are, for example, capable of operation in other orientations than those illustrated or otherwise described herein.

Additionally, the formation of a first feature over or on a second feature in the description that follows may include embodiments in which the first and second features are formed in direct contact, and may also include embodiments in which additional features may be formed interposing the first and second features, such that the first and second features may not be in direct contact.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of features is not necessarily limited to those features but may include other features not expressly listed or inherent to such process, method, article, or device. Occurrences of the phrase "in an embodiment" herein do not necessarily all refer to the same embodiment.

In addition, unless otherwise indicated, all numbers expressing quantities, ratios, and numerical properties of materials, reaction conditions, and so forth used in the specification and claims are to be understood as being modified in all instances by the term "about".

Furthermore, approximating language, as used herein throughout the specification and claims, may be applied to modify any quantitative representation that could permissibly vary without resulting in a change in the basic function to which it is related. Accordingly, a value modified by a term or terms, such as "approximately", "about,", "substantially" is not limited to the precise value specified. In some instances, the approximating language may correspond to the precision of an instrument for measuring the value. In other instances, the approximating language may correspond to within normal tolerances of the semiconductor industry. For example, "substantially coplanar" means substantially in a same plane within normal tolerances of the semiconductor industry, and "substantially perpendicular" means at an angle of 90 degrees plus or minus a normal tolerance of the semiconductor industry.

While several exemplary embodiments have been presented in the above detailed description of the device, it should be appreciated that a number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of features and methods of fabrication described in an exemplary embodiment without departing from the scope of this disclosure as set forth in the appended claims.

What is claimed is:

1. A substrate, comprising:
   a base consisting of crystalline semiconductor material;
   a semiconductor layer over the base, the semiconductor layer comprises:
     a first semiconductor layer portion having a first thickness;
     a second semiconductor layer portion having a second thickness and in direct contact with the base; and
     a third semiconductor layer portion having a third thickness, wherein the first thickness, the second thickness, and the third thickness are different from each other; and
   an insulator layer between the base and the semiconductor layer, wherein the first semiconductor layer portion and the third semiconductor layer portion are in direct contact with the insulator layer.

2. The substrate of claim 1, wherein the second thickness of the second semiconductor layer portion is greater than the first thickness of the first semiconductor layer portion.

3. The substrate of claim 1, wherein the third thickness of the third semiconductor layer portion is greater than the second thickness of the second semiconductor layer portion.

4. The substrate of claim 1, wherein the second semiconductor layer portion is between the first semiconductor layer portion and the third semiconductor layer portion.

5. The substrate of claim 4, wherein the first semiconductor layer portion and the third semiconductor layer portion are each electrically isolated from the second semiconductor layer portion by an isolation structure.

6. The substrate of claim 5, wherein the first semiconductor layer portion has an upper surface, the isolation structure has an upper surface, and the upper surface of the isolation structure is substantially coplanar with the upper surface of the first semiconductor layer portion.

7. The substrate of claim 1, wherein the first semiconductor layer portion has an upper surface, the second semiconductor layer portion has an upper surface, and the upper surface of the second semiconductor layer portion is substantially coplanar with the upper surface of the first semiconductor layer portion.

8. The substrate of claim 7, wherein the third semiconductor layer portion has an upper surface, and the upper surface of the third semiconductor layer portion is over the upper surface of the first semiconductor layer portion and the upper surface of the second semiconductor layer portion.

9. The substrate of claim 1, wherein the first semiconductor layer portion has a lower surface, the third semiconductor layer portion has a lower surface, and the lower surface of the third semiconductor layer portion is substantially coplanar with the lower surface of the first semiconductor layer portion.

10. The substrate of claim 9, wherein the second semiconductor layer portion has a lower surface, and the lower surface of the second semiconductor layer portion is under the lower surface of the first semiconductor layer portion and the lower surface of the third semiconductor layer portion.

11. A substrate, comprising:
    a base consisting of crystalline semiconductor material;
    a semiconductor layer over the base, the semiconductor layer comprises:
      a first semiconductor layer portion;
      a second semiconductor layer portion thicker than the first semiconductor layer portion; and
      a third semiconductor layer portion thicker than the second semiconductor layer portion;
    isolation structures separating the first semiconductor layer portion, the second semiconductor layer portion, and the third semiconductor layer portion from each other; and
    an insulator layer between the base and the first semiconductor layer portion, and between the base and the third semiconductor layer portion, and the second semiconductor layer portion is in direct contact with the base.

12. The substrate of claim 11, wherein the first semiconductor layer portion, the second semiconductor layer portion, and the third semiconductor layer portion consist essentially of the same material composition.

13. The substrate of claim 11, wherein the third semiconductor layer portion comprises a different material composition than the first semiconductor layer portion and the second semiconductor layer portion.

* * * * *